(12) United States Patent
Takagi

(10) Patent No.: US 7,218,658 B2
(45) Date of Patent: May 15, 2007

(54) SEMICONDUCTOR LASER DEVICE

(75) Inventor: Kazuhisa Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 452 days.

(21) Appl. No.: 10/918,358

(22) Filed: Aug. 16, 2004

(65) Prior Publication Data
US 2005/0163178 A1    Jul. 28, 2005

(30) Foreign Application Priority Data
Jan. 28, 2004    (JP) ............................. 2004-019698

(51) Int. Cl.
*H01S 5/00*    (2006.01)
*H01S 5/20*    (2006.01)
(52) U.S. Cl. ............................... 372/43.01; 372/45.01; 372/50.1
(58) Field of Classification Search ............. 372/43.01, 372/45.01
See application file for complete search history.

(56) References Cited

U.S. PATENT DOCUMENTS 6,974,974 B2 * 12/2005 Sato et al. .................... 257/79

FOREIGN PATENT DOCUMENTS

JP    2001-320125    11/2001

\* cited by examiner

*Primary Examiner*—Armando Rodriguez
(74) *Attorney, Agent, or Firm*—McDermott Will & Emery LLP

(57) ABSTRACT

A semiconductor laser device according to the present invention comprises an optical waveguide laminated structure having: a first first-cladding layer made up of a p-InP layer; a double heterojunction layer of p-AlGaInAs; a second first-cladding layer made up of a p-InP layer; a first light confining layer of p-InGaAsP; an active layer of InGaAsP having a quantum well structure; a second light confining layer of n-InGaAsP; and a second-cladding layer made up of an n-InP layer, and heterojunctions of the second kind are formed at the interfaces between the first first-cladding layer and the double heterojunction layer and between the double heterojunction layer and the second first-cladding layer.

6 Claims, 4 Drawing Sheets

SEMICONDUCTOR LASER DEVICE

BACKGROUND OF THE INVENTION

1. Field of the Invention

The present invention relates to a semiconductor laser device, and more particularly to a semiconductor laser device used as a light source for optical communications and optical disk devices.

2. Description of the Related Art

High-capacity, recordable and portable optical disk systems are growing rapidly in popularity and use as external storage for personal computers, etc. Semiconductor laser devices having high optical output efficiency and good optical and temperature characteristics must be developed to satisfy the requirements of small or portable optical disk systems. On the other hand, with the spread of public networks using optical fibers, there is an increasing need to transmit a large amount of information at low cost. Increasing the information transmission rate so as to meet such a need requires a semiconductor laser device having high optical output efficiency.

A known example of a conventional semiconductor laser device is a DFB laser device configured such that: a p-InP spacer layer having a film thickness of 200 nm is disposed on an MQW-SCH active layer; a diffraction grating made up of a GaInAsP layer is disposed on this spacer layer; and a p-InP first cladding layer having a diffraction grating buried therein is disposed on the GaInAsP diffraction grating disposed on the spacer layer (see, for example, paragraph [0024] and FIGS. 1 and 2 of Japanese Laid-Open Patent Publication No. 2001-320125).

However, the above DFB laser device has interfaces between the p-InP spacer layer and the diffraction grating made up of the GaInAsP layer and between the diffraction grating made up of the GaInAsP layer and the p-InP first cladding layer. At these interfaces are formed heterojunctions of the first kind, which have low energy levels for both types of carriers (electrons and holes). The bandgap energy of the diffraction grating made up of the GaInAsP layer is lower than those of the p-InP spacer layer and the p-InP first cladding layer.

Therefore, both electrons and holes are likely to accumulate in the GaInAsP layer constituting the diffraction grating since its bandgap energy is low. When the carrier concentrations of the accumulated electrons and holes each have reached approximately $1 \times 10^{18}$ cm$^{-3}$ (hereinafter 1E18 cm$^{-3}$), the electrons and holes combine within the diffraction grating layer and, as a result, an reactive current which does not contribute to the laser oscillation flows, causing the problem of increased threshold current of the laser oscillation and reduced luminous efficiency.

SUMMARY OF THE INVENTION

The present invention has been devised to solve the above problems. It is, therefore, a first object of the present invention to provide a semiconductor laser device exhibiting a small threshold current and high luminous efficiency, in which electrons and holes are prevented from accumulating to a high carrier concentration in the semiconductor layer sandwiched by the two heterojunctions (double heterojunction).

According to one-aspect of the invention, there is provided a semiconductor laser device comprising: a first semiconductor layer of a first conductive type having a first bandgap energy and a first impurity concentration; a second semiconductor layer of the first conductive type having a second bandgap energy and a second impurity concentration, laminated on the first semiconductor layer; an active layer having a third bandgap energy lower than the first and second bandgap energies, laminated on the first semiconductor layer with the second semiconductor layer interposed between the active layer and the first semiconductor layer; a third semiconductor layer of a second conductive type having a fourth bandgap energy higher than the third bandgap energy, laminated on the first semiconductor layer with the active layer and the second semiconductor layer interposed between the third semiconductor layer and the first semiconductor layer; a fourth semiconductor layer of the first conductive type having a third impurity concentration, disposed between the first semiconductor layer and the second semiconductor layer, and having both a higher conduction band energy level than the conduction band energy levels of the first and second semiconductor layers and a higher valence band energy level than the valence band energy levels of the first and second semiconductor layers, or having both a lower conduction band energy level than the conduction band energy levels of the first and second semiconductor layers and a lower valence band energy level than the valence band energy level of the first and second semiconductor layers; and a semiconductor substrate disposing, on a surface thereof, the first semiconductor layer, the second semiconductor layer, the active layer, the third semiconductor layer, and the fourth semiconductor layer such that either the first semiconductor layer or the third semiconductor layer is adjacent to and opposes the semiconductor substrate, and having the same conductive type as that of the one of the first semiconductor layer and the third semiconductor layer being adjacent to the semiconductor substrate.

Accordingly, a semiconductor laser device according to the present invention is configured such that: the bandgap energy of the fourth semiconductor layer is lower than those of the first and second semiconductor layers; and heterojunctions of the second kind are formed at the interfaces between the first and fourth semiconductor layers and between the second and fourth semiconductor layers. This arrangement prevents either minority carriers or majority carriers from accumulating in the fourth semiconductor layer, thereby reducing the probability of recombination between electrons and holes within the fourth semiconductor layer and hence reducing the recombination current.

Therefore, it is possible to prevent an increase in the threshold current and a reduction in the luminous efficiency due to the recombination current, providing a semiconductor laser device having high efficiency.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

First Embodiment

Figure 1:
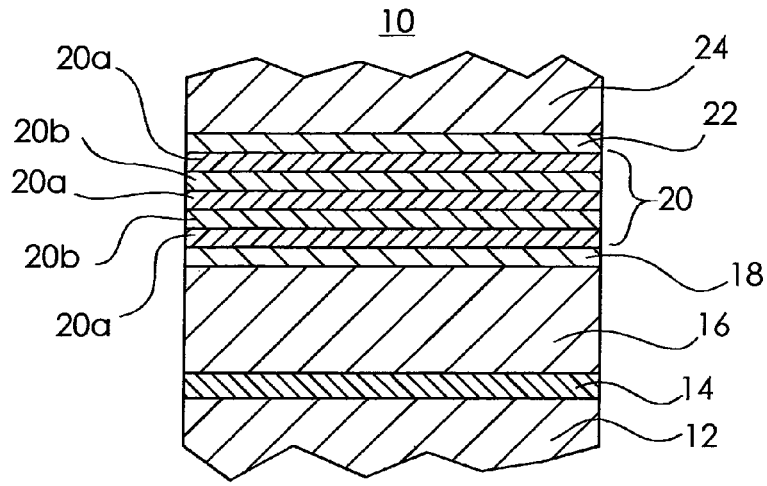
FIG. 1 is a cross-sectional view of a portion of a semiconductor laser device according to an embodiment of the present invention.

FIG. 1 is a cross-sectional view of a portion of a semiconductor laser device according to an embodiment of the present invention, the portion including an active layer and its neighborhood and having an optical waveguide laminated structure. It should be noted that in the following figures, like numerals will be used to denote like components.

Figure 2:
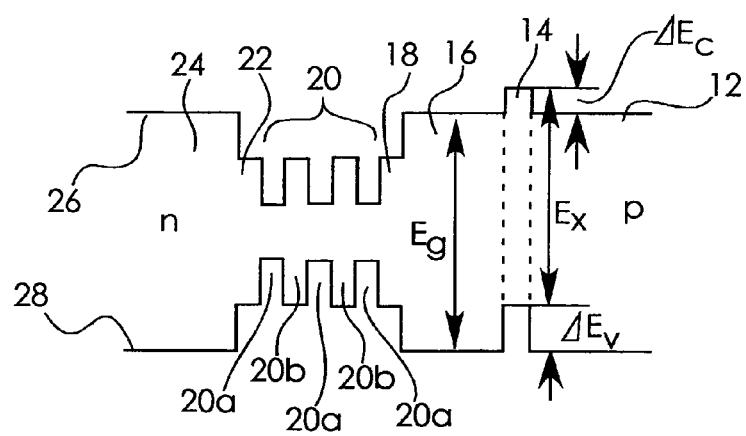
FIG. 2 is a diagram showing the energy bands of the optical waveguide laminated structure shown in FIG. 1.

FIG. 2 is a diagram showing the energy bands of the optical waveguide laminated structure shown in FIG. 1.

Referring to FIG. 1, a double heterojunction layer 14 is disposed on a first first-cladding layer 12, and a second first-cladding layer 16 is disposed on the double heterojunction layer 14. The first first-cladding layer 12 is made up of a p-type InP layer and acts as a first semiconductor layer (p-type and n-type are hereinafter abbreviated as "p-" and "n-", respectively); the double heterojunction layer 14 is made of p-AlGaInAs and acts as a fourth semiconductor layer; and the second first-cladding layer 16 is made up of a p-InP layer and acts as a second semiconductor layer.

Examples of the double heterojunction layer 14 include diffraction grating layers and etching stopper layers.

A first light confining layer 18 of p-InGaAsP is disposed on the second first-cladding layer 16, and an active layer 20 having a quantum well structure is disposed on the first light confining layer 18. Further, a second light confining layer 22 of n-InGaAsP is disposed on the active layer 20, and a second-cladding layer 24 made up of an n-InP layer and acting as a third semiconductor layer is disposed on the second light confining layer 22.

The active layer 20 having the quantum well structure is sandwiched by the first and second light confining layers 18 and 22 and made up of, as an example, three quantum well layers 20a of InGaAsP and two barrier layers 20b of InGaAsP alternately disposed onto one another, with two of the three quantum well layers 20a sandwiching the other quantum well layer 20a and the two barrier layers 20b (that is, these two quantum well layers 20a are disposed respectively adjacent to the first and second light confining layers 18 and 22).

Thus, the optical waveguide laminated structure 10 is made up of the first first-cladding layer 12, the double heterojunction layer 14, the second first-cladding layer 16, the first light confining layer 18, the active layer 20, the second light confining layer 22, and the second-cladding layer 24.

Referring now to FIG. 2, reference numeral 26 denotes the conduction band energy levels (indicated by upper lines), while reference numeral 28 denotes the valence band energy levels (indicated by lower lines). In the optical waveguide laminated structure 10, ordinary heterojunctions of the first kind are formed at the interfaces between the second first-cladding layer 16 and the first light confining layer 18, between the first light confining layer 18 and the quantum well layer 20a adjacent thereto, between each quantum well layer 20a and each barrier layer 20b adjacent thereto, between the second light confining layer 22 and the quantum well layer 20a adjacent thereto, and between the second light confining layer 22 and the second-cladding layer 24.

On the other hand, heterojunctions of the second kind are formed at the interfaces between the first first-cladding layer 12 and the double heterojunction layer 14 and between the double heterojunction layer 14 and the second first-cladding layer 16. That is, the bandgap energy of the double heterojunction layer 14 is lower than those of the first and second first-cladding layers 12 and 16. Further, the conduction band energy level of the double heterojunction layer 14 is higher than those of the first and second first-cladding layers 12 and 16, and the valence band energy level of the double heterojunction layer 14 is also higher than those of the first and second first-cladding layers 12 and 16. Such an arrangement is referred to as a heterojunction of the second kind.

In other words, if Eg denotes the bandgap energy of the first and second first-cladding layers 12 and 16, Ex denotes the bandgap energy of the double heterojunction layer 14, and ΔEv denotes the differences between the valence band energy level of the double heterojunction layer 14 and those of the first and second first-cladding layers 12 and 16, then the heterojunction of the second kind satisfies the relations: Eg>ΔEv, and Ex+ΔEv>Eg.

Referring to FIG. 2, as indicated by upper lines 26, the conduction band energy level of the double heterojunction layer 14 is higher than those of the first and second first-cladding layers 12 and 16. That is, since the energy level for minority carriers in the double heterojunction layer 14 (which has a lower bandgap energy than the first and second first-cladding layers 12 and 16) is higher than those in the first and second first-cladding layers 12 and 16, the electron concentration within the double heterojunction layer 14 is lower than those of the first and second first-cladding layers 12 and 16 adjacent to it. Further, if ΔEc denotes the differences between the conduction band energy level of the double heterojunction layer 14 and those of the first and second first-cladding layers 12 and 16, then ΔEv>ΔEc.

Therefore, few electrons accumulate in the double heterojunction layer 14 even though holes accumulate therein, reducing the probability of recombination between electrons and holes within the double heterojunction layer 14 and hence reducing the recombination current. This means that it is possible to prevent an increase in the threshold current and a reduction in the luminous efficiency due to the recombination current, providing a semiconductor laser device having high efficiency.

It should be noted that increasing the impurity concentration of the double heterojunction layer 14 is effective in further reducing the concentration of the small quantity of minority carriers accumulated within the double heterojunction layer 14. For example, n-type impurities include S, Si, and Se, while p-type impurities include Zn, Be, and Mg.

Generally, if the minority carrier concentration is set to $1E17$ cm$^{-3}$ or less, the recombination current is small. Therefore, the impurity concentration is set to $2E18$ cm$^{-3}$ or more, preferably $5E18$ cm$^{-3}$ or more, more preferably $1E19$ cm$^{-3}$ or more. It should be noted that increasing the impurity concentration reduces the Fermi level of the majority carriers, thereby reducing the band barrier and hence improving the majority carrier injection efficiency into the active layer.

First Variation

A first variation (of the first embodiment) also has the optical waveguide laminated structure 10 shown in FIG. 1 but employs different materials than the first embodiment.

Figure 3:
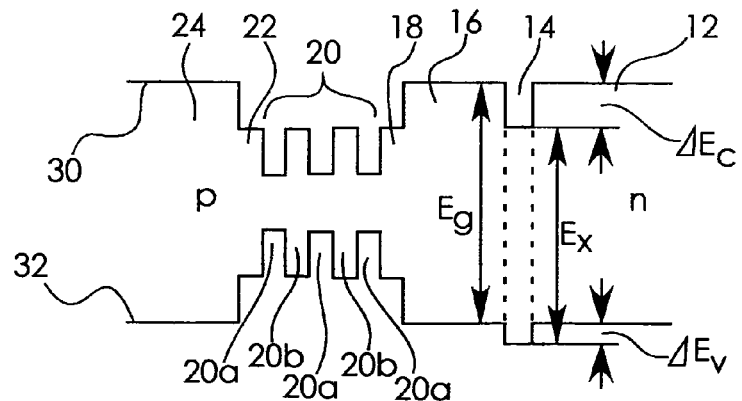
FIG. 3 is a diagram showing the energy bands of the optical waveguide laminated structure of the first variation of a semiconductor laser device according to an embodiment of the present invention.

FIG. 3 is a diagram showing the energy bands of the optical waveguide laminated structure of the first variation.

For example, the first variation includes: an n-$Al_{0.48}In_{0.52}As$ layer as the first first-cladding layer 12; an n-InP layer as the double heterojunction layer 14; an n-$Al_{0.48}In_{0.52}As$ layer as the second first-cladding layer 16; an n-$Al_xGa_{(1-x-0.52)}In_{0.52}As$ layer as the first light confining layer 18; undoped $Al_yGa_{(1-y-0.52)}In_{0.52}As$ layers as the quantum well layers 20a constituting the active layer 20 having a quantum well structure; undoped $Al_xGa_{(1-x-0.52)}In_{0.52}As$ layers as the barrier layers 20b; a p-$Al_xGa_{(1-x-0.52)}In_{0.52}As$ layer as the second light confining layer 22; and a p-$Al_{0.48}In_{0.52}As$ layer as the second-cladding layer 24. It should be noted that the material composition ratios x and y are such that $0 \leq y < x \leq 0.48$.

An example of the double heterojunction layer 14 for the first variation is an etching stopper layer.

In the energy band diagram of the optical waveguide laminated structure 10 shown in FIG. 3, reference numeral 30 denotes the conduction band energy levels (indicated by upper lines), while reference numeral 32 denotes the valence band energy levels (indicated by lower lines).

Also in the optical waveguide laminated structure 10 of the first variation, heterojunctions of the second kind are formed at the interfaces between the first first-cladding layer 12 and the double heterojunction layer 14 and between the double heterojunction layer 14 and the second first-cladding layer 16, as shown in FIG. 3. It should be noted that the first variation satisfies the relation: $\Delta Ev < \Delta Ec$.

Referring to FIG. 3, as indicated by lower lines 32, the valence band energy level of the double heterojunction layer 14 is lower than those of the first and second first-cladding layers 12 and 16. That is, the double heterojunction layer 14 has a lower bandgap energy than the first and second first-cladding layers 12 and 16; the energy level for holes (minority carriers) in the double heterojunction layer 14 is higher than the valence band energy levels of the first and second first-cladding layers 12 and 16; and the hole concentration within the double heterojunction layer 14 is lower than those of the first and second first-cladding layers 12 and 16 adjacent to it. Therefore, few holes accumulate in the double heterojunction layer 14 even though electrons accumulate therein, reducing the probability of recombination between electrons and holes within the double heterojunction layer 14 and hence reducing the recombination current. This means that it is possible to prevent an increase in the threshold current and a reduction in the luminous efficiency due to the recombination current, providing a semiconductor laser device having high efficiency.

It should be noted that the first variation may employ other materials. For example, it may include: n-$Al_zGa_{(1-z)}As$ layers as the first and second first-cladding layers 12 and 16; an n-AlAs layer as the double heterojunction layer 14; an n-$Al_xGa_{(1-x)}As$ layer as the first light confining layer 18; undoped $Al_yGa_{(1-y)}As$ layers as the quantum well layers 20a; undoped $Al_xGa_{(1-x)}As$ layers as the barrier layers 20b; a p-$Al_xGa_{(1-x)}As$ layer as the second light confining layer 22; and a p-$Al_zGa_{(1-z)}As$ layer as the second-cladding layer 24. It should be noted that the material composition ratios x, y, and z are such that $0 \leq y < x < z < 1$.

Second Variation

According to the first embodiment and the first variation, the energy level for minority carriers in the double heterojunction layer 14 is higher than those in the first and second first-cladding layers 12 and 16. According to a second variation (of the present embodiment), however, the energy level for majority carriers in the double heterojunction layer 14 is higher than those in the first and second first-cladding layers 12 and 16.

Figure 4:
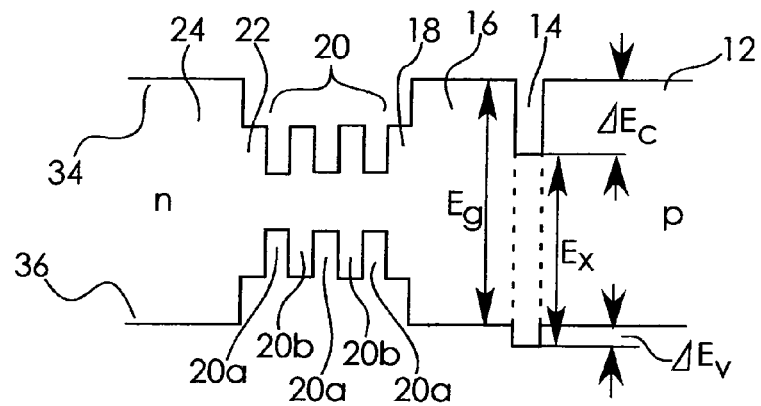
FIG. 4 is a diagram showing the energy bands of the optical waveguide laminated structure of the second variation of a semiconductor laser device according to an embodiment of the present invention.

FIG. 4 is a diagram showing the energy bands of the optical waveguide laminated structure of the second variation.

For example, the second variation (of the first embodiment) includes: a p-$Al_{0.48}In_{0.52}As$ layer as the first first-cladding layer 12; a p-InP layer as the double heterojunction layer 14; a p-$Al_{0.48}In_{0.52}As$ layer as the second first-cladding layer 16; a p-$Al_xGa_{(1-x-0.52)}In_{0.52}As$ layer as the first light confining layer 18; undoped $Al_yGa_{(1-y-0.52)}In_{0.52}As$ layers as the quantum well layers 20a constituting the active layer 20 having a quantum well structure; undoped $Al_xGa_{(1-x-0.52)}In_{0.52}As$ layers as the barrier layers 20b; an n-$Al_xGa_{(1-x-0.52)}In_{0.52}As$ layer as the second light confining layer 22; and an n-$Al_{0.48}In_{0.52}As$ layer as the second-cladding layer 24.

It should be noted that the material composition ratios x and y are such that $0 \leq y < x \leq 0.48$.

Examples of the double heterojunction layer 14 of the second variation include etching stopper layers and diffraction grating layers.

In the energy band diagram of the optical waveguide laminated structure 10 shown in FIG. 4, reference numeral 34 denotes the conduction band energy levels (indicated by upper lines), while reference numeral 36 denotes the valence band energy levels (indicated by lower lines).

Also in the optical waveguide laminated structure 10 of the second variation, heterojunctions of the second kind are formed at the interfaces between the first first-cladding layer 12 and the double heterojunction layer 14 and between the double heterojunction layer 14 and the second first-cladding layer 16, as shown in FIG. 4. It should be noted that the second variation satisfies the relation: $\Delta Ev < \Delta Ec$.

Referring to FIG. 4, as indicated by lower lines 36, the valence band energy level of the double heterojunction layer 14 is lower than those of the first and second first-cladding layers 12 and 16. It should be noted that whereas the double heterojunction layer 14 and the first and second first-cladding layers 12 and 16 of the first variation are of n-conductive type, those of the second variation are of p-conductive type.

That is, the double heterojunction layer 14 has a lower bandgap energy than the first and second first-cladding layers 12 and 16; the energy level for holes (majority carriers) in the double heterojunction layer 14 is higher than the valence band energy levels of the first and second first-cladding layers 12 and 16; and the hole concentration within the double heterojunction layer 14 is lower than those of the first and second first-cladding layers 12 and 16 adjacent to it.

Therefore, few holes (majority carriers) accumulate in the double heterojunction layer 14 even though electrons (minority carriers) accumulate therein, reducing the probability of recombination between electrons and holes within the double heterojunction layer 14 and hence reducing the recombination current. This means that it is possible to prevent an increase in the threshold current and a reduction in the luminous efficiency due to the recombination current, providing a semiconductor laser device having high efficiency.

It should be noted that the second variation may employ other materials. For example, it may include: p-$Al_zGa_{(1-z)}As$ layers as the first and second first-cladding layers 12 and 16; a p-AlAs layer as the double heterojunction layer 14; a p-$Al_zGa_{(1-x)}As$ layer as the first confining layer 18; undoped $Al_yGa_{(1-y)}As$ layer as the quantum well layers 20a; undoped $Al_xGa_{(1-x)}As$ layers as the barrier layers 20b; an n-$Al_xGa_{(1-x)}As$ layer as the second light confining layer 22; and an n-$Al_zGa_{(1-z)}As$ layer as the second-cladding layer 24. It should be noted that the material composition ratios x, y, and z are such that $0 \leq y<x<z<1$.

Third Variation

A third variation (of the present embodiment) is also configured such that the energy level for majority carriers in the double heterojunction layer 14 is higher than those in the first and second first-cladding layers 12 and 16.

Figure 5:
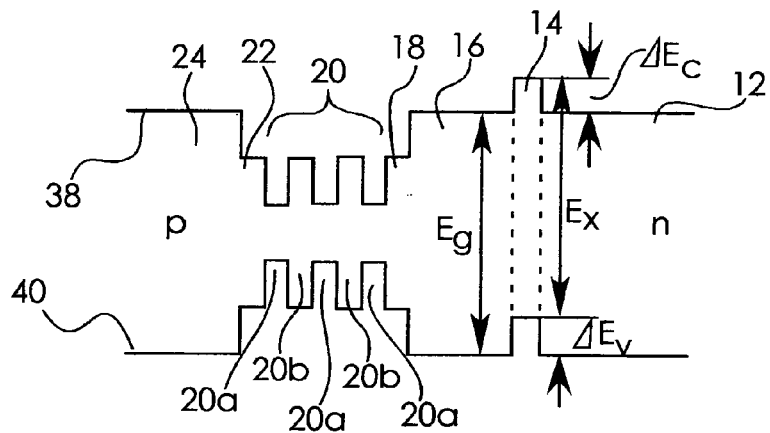
FIG. 5 is a diagram showing the energy bands of the optical waveguide laminated structure of the third variation of a semiconductor laser device according to an embodiment of the present invention.

FIG. 5 is a diagram showing the energy bands of the optical waveguide laminated structure of the third variation.

For example, the third variation (of the first embodiment) includes: an n-InP layer as the first first-cladding layer 12; an n-AlGaInAs layer as the double heterojunction layer 14; an n-InP layer as the second first-cladding layer 16; an n-InGaAsP layer as the first light confining layer 18; InGaAsP layers as the quantum well layers 20a constituting the active layer 20 having a quantum well structure; InGaAsP layers as the barrier layers 20b; a p-InGaAsP layer as the second light confining layer 22; and a p-InP layer as the second-cladding layer 24.

Examples of the double heterojunction layer 14 of the third variation include etching stopper layers and diffraction grating layers.

In the energy band diagram of the optical waveguide laminated structure 10 shown in FIG. 5, reference numeral 38 denotes the conduction band energy levels (indicated by upper lines), while reference numeral 40 denotes the valence band energy levels (indicated by lower lines).

Also in the optical waveguide laminated structure 10 of the third variation, heterojunctions of the second kind are formed at the interfaces between the first first-cladding layer 12 and the double heterojunction layer 14 and between the double heterojunction layer 14 and the second first-cladding layer 16, as shown in FIG. 5.

In FIG. 5, as indicated by upper lines 38, the conduction band energy level of the double heterojunction layer 14 is higher than those of the first and second first-cladding layers 12 and 16. This may appear to be the same as in the first embodiment shown in FIG. 2. However, whereas the double heterojunction layer 14 and the first and second first-cladding layers 12 and 16 in the configuration shown in FIG. 2 are p-type layers, those in the configuration of the third variation are n-type layers.

That is, in the configuration of the first embodiment shown in FIG. 2, the energy level for minority carriers in the double heterojunction layer 14 (which has a lower bandgap energy than the first and second first-cladding layers 12 and 16) is higher than those in the first and second first-cladding layers 12 and 16. In the configuration of the third variation, on the other hand, the energy level for majority carriers in the double heterojunction 14 (which has a lower bandgap energy than the first and second first-cladding layers 12 and 16) is higher than those in the first and second first-cladding layers 12 and 16. Therefore, since the electron concentration within the double heterojunction layer 14 is lower than those of the first and second first-cladding layers 12 and 16 adjacent to it, few electrons accumulate in the double heterojunction layer 14 even though holes accumulate therein, reducing the probability of recombination between electrons and holes within the double heterojunction layer 14 and hence reducing the recombination current. This means that it is possible to prevent an increase in the threshold current and a reduction in the luminous efficiency due to the recombination current, providing a semiconductor laser device having high efficiency.

According to the first embodiment and the first to third variations described above, semiconductor laser devices having an optical waveguide laminated structure are configured such that heterojunctions of the second kind are formed at the interfaces both between the first first-cladding layer 12 and the double heterojunction layer 14 and between the double heterojunction layer 14 and the second first-cladding layer 16. This arrangement prevents either minority carriers or majority carriers from accumulating in the double heterojunction layer 14, thereby reducing the probability of recombination between electrons and holes within the double heterojunction layer 14 and hence reducing the recombination current. Therefore, it is possible to prevent an increase in the threshold current and a reduction in the luminous efficiency due to the recombination current, providing a semiconductor laser device having high efficiency.

Further, in the configurations in which minority carriers are prevented from accumulating in the double heterojunction layer 14, the impurity concentration of the double heterojunction layer 14 may be increased to further reduce the concentration of the small quantity of minority carriers accumulated within the double heterojunction layer 14. For example, the impurity concentration may be set to $2E18$ $cm^{-3}$ or more, preferably $5E18$ $cm^{-3}$ or more, more preferably $1E19$ $cm^{-3}$ or more. It should be noted that increasing the impurity concentration reduces the Fermi level of the majority carriers, thereby reducing the band barrier and hence improving the majority carrier injection efficiency into the active layer.

Thus, the configurations in which the minority carriers are prevented from accumulating in the double heterojunction layer 14 can provide a semiconductor laser device having higher efficiency.

Second Embodiment

Figure 6:
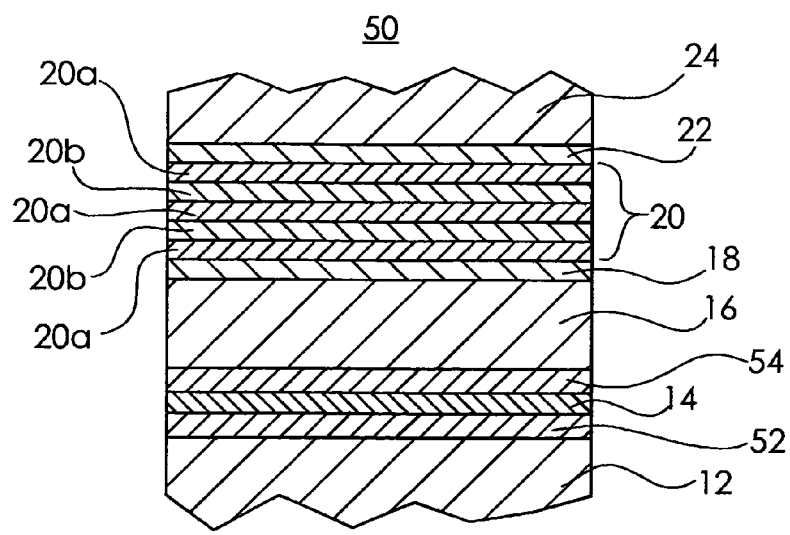
FIG. 6 is a cross-sectional view of a portion of a semiconductor laser device according to an embodiment of the present invention.
Figure 7:
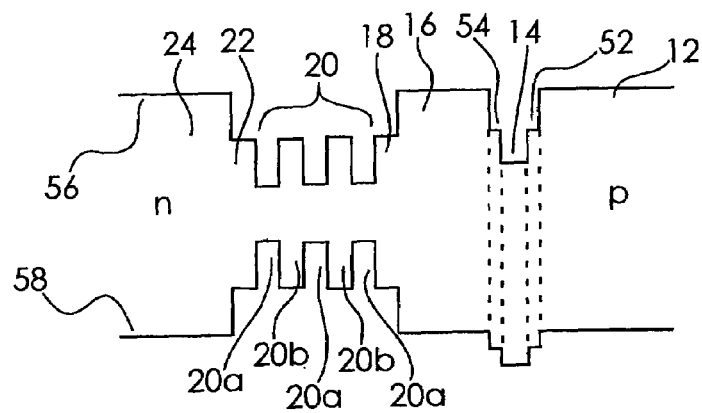
FIG. 7 is a diagram showing the energy bands of the optical waveguide laminated structure shown in FIG. 6.

FIG. 6 is a cross-sectional view of a portion of a semiconductor laser device according to an embodiment of the present invention, the portion including an active layer and its neighborhood and having an optical waveguide laminated structure. FIG. 7 is a diagram showing the energy bands of the optical waveguide laminated structure shown in FIG. 6.

The basic configuration of the optical waveguide laminated structure 50 of the present embodiment is the same as that of the optical waveguide laminated structure 10 of the second variation (of the first embodiment). However, the optical waveguide laminated structure 50 is different from the optical waveguide laminated structure 10 of the second variation (of the first embodiment) in that the optical waveguide laminated structure 50 includes band discontinuity alleviating layers both between the first first-cladding layer 12 and the double heterojunction layer 14 and between the double heterojunction layer 14 and the second first-cladding layer 16.

Referring to FIG. 6, a first band discontinuity alleviating layer 52 is disposed between the first first-cladding layer 12 and the double heterojunction layer 14, while a second band discontinuity alleviating layer 54 is disposed between the double heterojunction layer 14 and the second first-cladding layer 16. The first and second band discontinuity alleviating layers 52 and 54 act as the fifth and the sixth semiconductor layers, respectively.

For example, the optical waveguide laminated structure 50 may have the same basic configuration as that of the optical waveguide laminated structure of the second variation (of the first embodiment).

That is, the present embodiment includes: a p-$Al_{0.48}In_{0.52}As$ layer as the first first-cladding layer 12; a p-InP layer as the double heterojunction layer 14; a p-$Al_{0.48}In_{0.52}As$ layer as the second first-cladding layer 16; a p-$Al_xGa_{(1-x-0.52)}In_{0.52}As$ layer as the first light confining layer 18; undoped $Al_yGa_{(1-y-0.52)}In_{0.52}As$ layers as the quantum well layers 20a constituting the active layer 20 having a quantum well structure; undoped $Al_xGa_{(1-x-0.52)}In_{0.52}As$ layers as the barrier layers 20b; an n-$Al_xGa_{(1-x-052)}In_{0.52}As$ layer as the second light confining layer 22; and an n-$Al_{0.48}In_{0.52}As$ layer as the second-cladding layer 24. It should be noted that the material composition ratios x and y are such that $0 \leq y < x \leq 0.48$.

With this configuration, the first band discontinuity alleviating layer 52 may be formed of p-InGaAsP having a bandgap wavelength of λ1, and the second band discontinuity alleviating layer 54 may be formed of p-InGaAsP having a bandgap wavelength of λ2. It should be noted that $0.98 \, \mu m \leq \lambda 1 \leq 1.1 \, \mu m$, and $0.98 \, \mu m \leq \lambda 2 \leq 1.1 \, \mu m$.

In the energy band diagram of the optical waveguide laminated structure 50 shown in FIG. 7, reference numeral 56 denotes the conduction band energy levels (indicated by upper lines), while reference numeral 58 denotes the valence band energy levels (indicated by lower lines).

As shown in FIG. 7, in the optical waveguide laminated structure 50 having the above configuration, the energy levels for holes in the first and second band discontinuity alleviating layers 52 and 54 are lower than that in the double heterojunction layer 14 and higher than those in the first and second first-cladding layers 12 and 16.

Therefore, the first and second band discontinuity alleviating layers 52 and 54 ease the energy barrier of the double heterojunction layer 14 when holes flow from the first first-cladding layer 12 into the quantum well layer 20a, which increases the hole injection efficiency into the quantum well layer 20a and hence increases the luminous efficiency, leading to a semiconductor laser device having high efficiency.

It should be noted that the second embodiment may employ other materials. For example, it may include: p-$Al_zGa_{(1-z)}As$ layers as the first and second first-cladding layers 12 and 16; a p-AlAs layer as the double heterojunction layer 14; a p-$Al_xGa_{(1-x)}As$ layer as the first light confining layer 18; undoped $Al_yGa_{(1-y)}As$ layers as the quantum well layers 20a; undoped $Al_xGa_{(1-x)}As$ layers as the barrier layers 20b; an n-$Al_xGa_{(1-x)}As$ layer as the second light confining layer 22; and an n-$Al_zGa_{(1-z)}As$ layer as the second-cladding layer 24. In such a case, the second embodiment may further include a p-$Al_uGa_{(1-u)}As$ layer as the first band discontinuity alleviating layer 52 and a p-$Al_vGa_{(1-v)}As$ layer as the second band discontinuity alleviating layer 54. It should be noted that the material composition ratios x, y, z, u, and v are such that $0 \leq y < x < z < u < 1$, and $0 \leq y < x < z < v < 1$.

Fourth Variation

The basic configuration of a fourth variation (of the second embodiment) is the same as that of the third variation (of the first embodiment). However, the optical waveguide laminated structure (50) of the fourth variation is different from that of the third variation in that it includes band discontinuity alleviating layers both between the first first-cladding layer 12 and the double heterojunction layer 14 and between the double heterojunction layer 14 and the second first-cladding layer 16.

Figure 8:
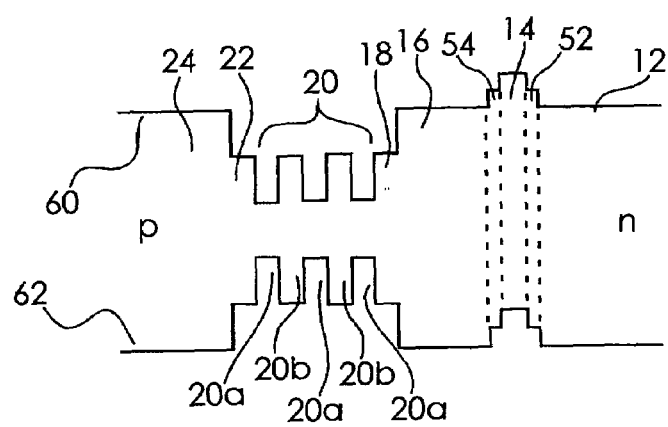
FIG. 8 is a diagram showing the energy bands of the optical waveguide laminated structure of the fourth variation of a semiconductor laser device according to an embodiment of the present invention.

FIG. 8 is a diagram showing the energy bands of the optical waveguide laminated structure of the fourth variation. The optical waveguide laminated structure 50 of the fourth variation (of the second embodiment) has the same basic configuration as that of the optical waveguide laminated structure of the third variation. That is, the fourth variation includes: an n-InP layer as the first first-cladding layer 12; an n-AlGaInAs layer as the double heterojunction layer 14; an n-InP layer as the second first-cladding layer 16; an n-InGaAsP layer as the first light confining layer 18; InGaAsP layers as the quantum well layers 20a constituting the active layer 20 having a quantum well structure; InGaAsP layers as the barrier layers 20b; a p-InGaAsP layer as the second light confining layer 22; and a p-InP layer as the second-cladding layer 24.

In this configuration, the first and second band discontinuity alleviating layers 52 and 54 are formed of n-AlGaInAs. Their conduction band energy levels are lower than that of the double heterojunction layer 14 and higher than those of the first and second first-cladding layers 12 and 16. That is, the n-AlGaInAs material constituting the first and second band discontinuity alleviating layers 52 and 54 has an Al composition ratio larger than 0 and smaller than that of the n-AlGaInAs material constituting the double heterojunction layer 14. Examples of the double heterojunction layer 14 of the fourth variation include etching stopper layers and diffraction layers.

In the energy band diagram of the optical waveguide laminated structure 50 shown in FIG. 8, reference numeral 60 denotes the conduction band energy levels (indicated by upper lines), while reference numeral 62 denotes the valence band energy levels (indicated by lower lines).

As shown in FIG. 8, in the optical waveguide laminated structure 50 having the above configuration, the energy levels for electrons in the first and second band discontinuity alleviating layers 52 and 54 are lower than that in the double heterojunction layer 14 and higher than those in the first and second first-cladding layers 12 and 16.

Therefore, the first and second band discontinuity alleviating layers 52 and 54 ease the energy barrier of the double heterojunction layer 14 when electrons flow from the first first-cladding layer 12 into the quantum well layer 20a, which increases the electron injection efficiency into the quantum well layer 20a and hence increases the luminous efficiency, leading to a semiconductor laser device having high efficiency.

As described above, the optical waveguide laminated structures of semiconductor laser devices according to the second embodiment and the fourth variation (of the second embodiment) are configured such that: the energy level for majority carriers in the double heterojunction layer 14 (which has a lower bandgap energy than the first and second first-cladding layers 12 and 16) is higher than those in the first and second first-cladding layers 12 and 16; and the first band discontinuity alleviating layer 52 is disposed between the first first-cladding layer 12 and the double heterojunction layer 14, and the second band discontinuity alleviating layer 54 is disposed between the double heterojunction layer 14 and the second first-cladding layer 16. This arrangement allows the first and second band discontinuity alleviating layers 52 and 54 to ease the barrier of the double heterojunction layer 14 when majority carriers flow from the first first-cladding layer 12 into the quantum well layer 20a, which increases the majority carrier injection efficiency into the quantum well layer 20a and hence increases the luminous efficiency, leading to a semiconductor laser device having high efficiency.

Third Embodiment

Figure 9:
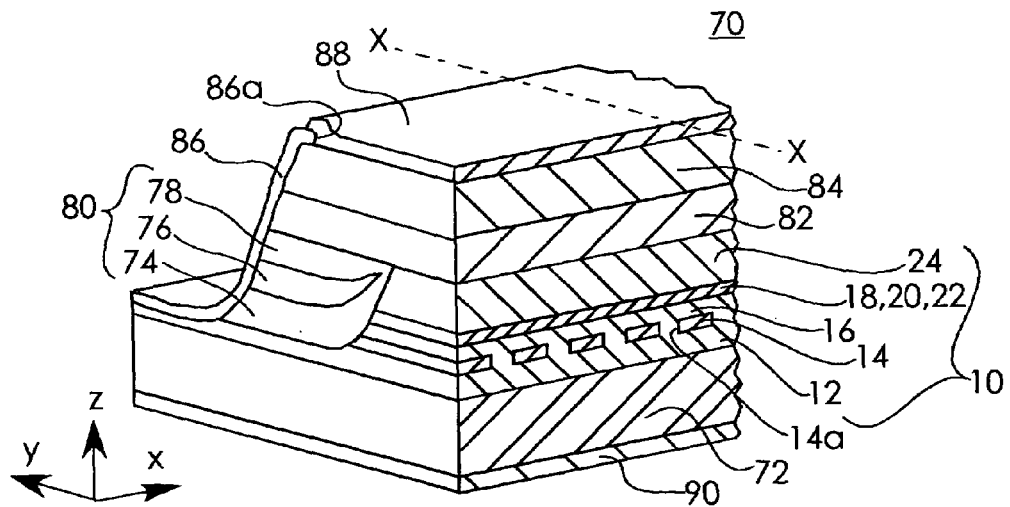
FIG. 9 is a cross-sectional perspective view of a portion of a semiconductor laser according to an embodiment of the present invention.
Figure 10:
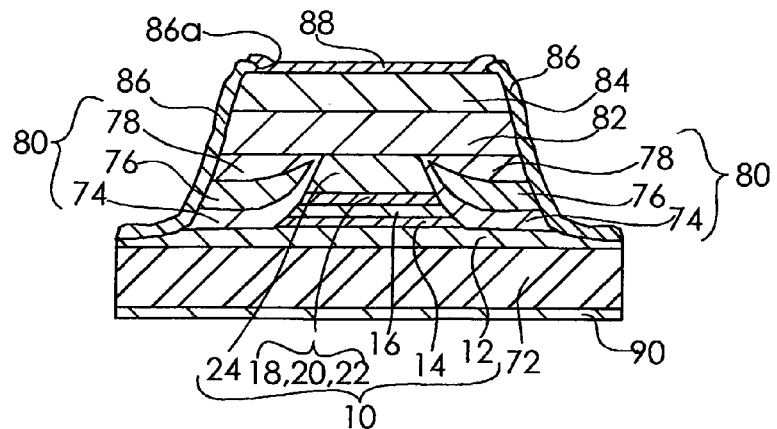
FIG. 10 is a cross-sectional view of the semiconductor laser shown in FIG. 9 taken along line X—X.

FIG. 9 is a cross-sectional perspective view of a portion of a semiconductor laser according to an embodiment of the present invention. FIG. 10 is a cross-sectional view of the semiconductor laser shown in FIG. 9 taken along line X—X.

Specifically, FIG. 9 shows a cross section of a distributed feedback semiconductor laser (hereinafter referred to as a DFB laser) 70 taken along a line in the optical waveguide direction (the x-axis direction); the semiconductor laser is symmetrical about this line. FIG. 10 shows a cross section of the DFB laser 70 taken along line X—X in the y-axis direction.

The DFB laser 70 is characterized in that its oscillation wavelength depends on the period of the diffraction grating and it can generate single-mode oscillation. This laser is also used for communications.

Referring to FIGS. 9 and 10, a first first-cladding layer 12 made up of a p-InP layer is disposed on a p-InP substrate 72 (the semiconductor substrate), and a double heterojunction layer 14 is disposed on the first first-cladding layer 12. According to the third embodiment, the double heterojunction layer 14 is a diffraction grating layer having therein strip-shaped openings 14a extending in the y direction, and is made up of a p-AlGaInAs layer. A second first-cladding layer 16 made up of a p-InP layer is disposed on the double heterojunction layer 14 such that the second first-cladding layer 16 fills the openings 14a.

A first light confining layer 18 of p-InGaAsP is disposed on the second first-cladding layer 16, and an active layer 20 having a quantum well structure is disposed on the first light confining layer 18. Further, a second light confining layer 22 of n-InGaAsP is disposed on the active layer 20, and a second-cladding layer 24 made up of an n-InP layer is disposed on the second light confining layer 22.

The active layer 20 having the quantum well structure is sandwiched by the first and second light confining layers 18 and 22 and made up of a plurality of quantum well layers 20a of InGaAsP and a plurality of barrier layers 20b of InGaAsP alternately disposed onto one another, with two of the plurality of quantum well layers 20a sandwiching the other quantum well layers 20a and the plurality of barrier layers 20b (that is, these two quantum well layers 20a are disposed respectively adjacent to the first and second light confining layers 18 and 22).

It should be noted that even though FIGS. 9 and 10 collectively show the first light confining layer 18, the active layer 20, and the second light confining layer 22 as a single layer, this laminated structure is the same as that of the first embodiment shown in FIG. 1. Thus, the optical waveguide laminated structure (denoted by reference numeral 10) is made up of the first first-cladding layer 12, the double heterojunction layer 14, the second first-cladding layer 16, the first light confining layer 18, the active layer 20, the second light confining layer 22, and the second-cladding layer 24, as in the first embodiment.

According to the third embodiment, the optical waveguide laminated structure 10 is formed such that it has a ridge shape and extends in the optical waveguide direction (the x-axis direction). On both sides of the ridge-shaped optical waveguide laminated structure 10 are formed a p-InP current blocking layer 74, an n-InP current blocking layer 76, and a p-InP current blocking layer 78 laminated onto one another over the semiconductor substrate in that order, forming a current constriction structure 80. This arrangement allows the drive current to efficiently flow though the active layer 20 within the ridge. It should be noted that the current blocking layers 74 and 78 may be made of Fe-InP, instead of p-InP.

An n-InP contact layer 82 is disposed on both the p-InP current blocking layer 78 of the current constriction structure 80 and the second-cladding layer 24 of the optical waveguide laminated structure 10, and an n-InGaAs contact layer 84 is disposed on the n-InP contact layer 82.

The current constriction structure 80, the optical waveguide laminated structure 10, and the n-InP and the n-InGaAs contact layers 82 and 84 disposed thereon are each formed to have a ridge shape and extend in the optical waveguide direction (the x-axis direction). A passivation film 86 of $SiO_2$ is disposed over the entire ridge-shaped laminated structure. (The passivation film 86 has an opening 86a exposing the top of the ridge-shaped laminated structure.) A cathode electrode 88 is disposed on the n-InGaAs contact layer 84 through the opening 86a, while an anode electrode 90 is disposed on the rear surface of the p-InP substrate 72.

The optical waveguide laminated structure 10 of the third embodiment is the same as that of the first embodiment. That is, heterojunctions of the second kind are formed at the interfaces between the first first-cladding layer 12 and the double heterojunction layer 14 and between the double heterojunction layer 14 and the second first-cladding layer 16.

Therefore, since the energy level for minority carriers in the double heterojunction layer 14 (which has a lower bandgap energy than the first and second first-cladding layers 12 and 16) is higher than those in the first and second first-cladding layers 12 and 16, the electron concentration within the double heterojunction layer 14 is lower than those of the first and second first-cladding layers 12 and 16 adjacent to it.

This means that few electrons accumulate in the double heterojunction layer 14 even though holes accumulate therein, reducing the probability of recombination between electrons and holes within the double heterojunction layer 14 and hence reducing the recombination current. Therefore, it is possible to prevent an increase in the threshold current and a reduction in the luminous efficiency due to the recombination current, providing a semiconductor laser device having high efficiency.

The present embodiment has been described with respect to a semiconductor laser in which the optical waveguide laminated structure 10 of the first embodiment is disposed on the p-InP substrate 72 such that the first first-cladding layer 12 made up of a p-type semiconductor layer is adjacent to and faces the p-InP substrate 72. However, the present embodiment may be applied to a semiconductor laser in which the optical waveguide laminated structure 10 of the second variation (of the first embodiment) or the optical waveguide laminated structure 50 of the second embodiment is disposed on the p-InP substrate 72 such that the first-first cladding layer 12 made up of a p-type semiconductor layer is adjacent to and faces the p-InP substrate 72.

In these cases, the p-type double heterojunction layer 14 (which is a diffraction grating layer) is disposed between the first and second first-cladding layers 12 and 16 which are each made up of a p-type semiconductor layer and disposed on the p-InP substrate 72 side of the active layer 20.

Further, the present embodiment may be applied to a semiconductor laser in which the optical waveguide laminated structure 10 of the first or third variation (of the first embodiment) or the optical waveguide laminated structure 50 of the fourth variation (of the second embodiment) is disposed on the p-InP substrate 72 such that the second-cladding layer 24 made up of a p-type semiconductor layer is adjacent to and faces the p-InP substrate 72. In this case, the n-type double heterojunction layer 14 (which is a diffraction grating layer) is disposed between first and second first-cladding layers 12 and 16 which are each made up of an n-type semiconductor layer and disposed opposite the p-InP substrate 72 side of the active layer 20.

Still further, the present embodiment may be applied to a semiconductor laser in which the optical waveguide laminated structure 10 of the first or third variation (of the first embodiment) or the optical waveguide laminated structure 50 of the fourth variation (of the second embodiment) is disposed on an n-type semiconductor substrate such that the first first-cladding layer 12 made up of an n-type semiconductor layer is adjacent to and faces the n-type semiconductor substrate. In this case, the n-type double heterojunction layer 14 (which is a diffraction grating layer) is disposed between the first and second first-cladding layers 12 and 16 which are each made up of an n-type semiconductor layer and disposed on the n-type semiconductor substrate side of the active layer 20.

Still further, the present embodiment may be applied to a semiconductor laser in which the optical waveguide laminated structure 10 of the first embodiment or the second variation (of the first embodiment) or the optical waveguide laminated structure 50 of the second embodiment is disposed on an n-type substrate such that the second-cladding layer 24 made up of an n-type semiconductor layer is adjacent to and faces the n-type substrate. In this case, the p-type double heterojunction layer 14 (which is a diffraction grating layer) is disposed between first and second first-cladding layer 12 and 16 which are each made up of a p-type semiconductor layer and disposed opposite the n-type substrate side of the active layer 20.

It should be noted that the configuration of the current constriction structure 80 is the same whether an n-type or p-type substrate is used.

As described above, according to the present embodiment, a DFB laser is configured such that heterojunctions of the second kind are formed at the interfaces between the first first-cladding layer 12 and the double heterojunction layer 14 (a diffraction grating layer) and between the double heterojunction layer 14 and the second first-cladding layer 16. This arrangement prevents either minority carriers or majority carriers from accumulating in the double heterojunction layer 14, thereby reducing the probability of recombination between electrons and holes within the double heterojunction layer 14 and hence reducing the recombination current. Therefore, it is possible to prevent an increase in the threshold current and a reduction in the luminous efficiency due to the recombination current, providing a DFB laser device having high efficiency.

Fourth Embodiment

Figure 11:
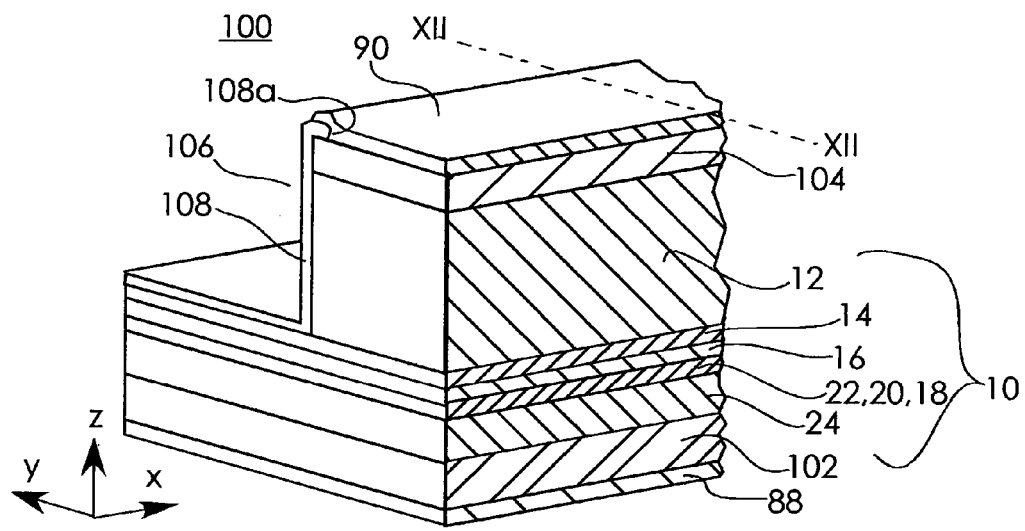
FIG. 11 is a cross-sectional perspective view of a portion of a semiconductor laser according to an embodiment of the present invention.
Figure 12:
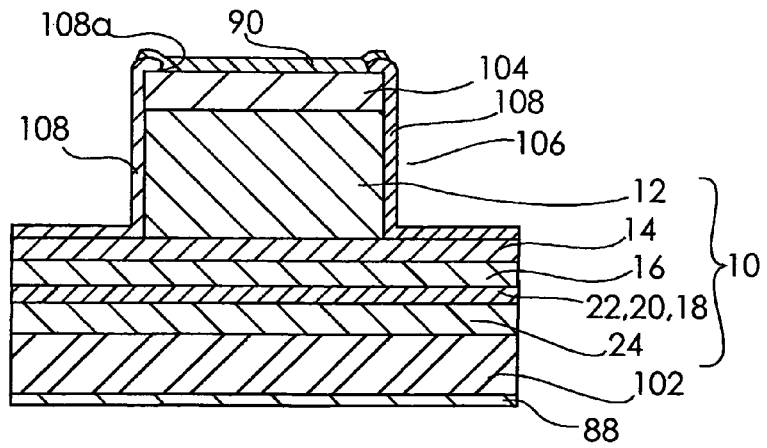
FIG. 12 is a cross-sectional view of the semiconductor laser shown in FIG. 11 taken along line XII—XII.

FIG. 11 is a cross-sectional perspective view of a portion of a semiconductor laser according to an embodiment of the present invention. FIG. 12 is a cross-sectional view of the semiconductor laser shown in FIG. 11 taken along line XII—XII.

The ridge type semiconductor laser 100 shown in FIG. 11 is used for optical disk systems and optical communications. FIG. 11 shows a cross section of the ridge type semiconductor laser 100 taken along a line in the optical waveguide direction (the x-axis direction); the ridge type semiconductor laser 100 is symmetrical about this line. FIG. 12 shows a cross section of the ridge type semiconductor laser 100 taken along line XII—XII in the y-axis direction.

Referring to FIGS. 11 and 12, a second-cladding layer 24 made up of an n-InP layer is disposed on an n-InP substrate 102 (the semiconductor substrate), and a second light confining layer 22 of n-InGaAsP is disposed on the second-cladding layer 24. Further, an active layer 20 having a quantum well structure is disposed on the second light confining layer 22, and a first light confining layer 18 of p-InGaAsP is disposed on the active layer 20.

The active layer 20 having the quantum well structure is sandwiched by the first and second light confining layers 18 and 22 and made up of a plurality of quantum well layers 20a of InGaAsP and a plurality of barrier layers 20b of InGaAsP alternately disposed onto one another, with two of the plurality of quantum well layers 20a sandwiching the other quantum well layers 20a and the plurality of barrier layers 20b (that is, these two quantum well layers 20a are disposed respectively adjacent to the first and second light confining layers 18 and 22).

It should be noted that even though FIGS. 11 and 12 collectively show the first light confining layer 18, the active layer 20, and the second light confining layer 22 as a single layer, this laminated structure is the same as that of the first embodiment shown in FIG. 1.

A second first-cladding layer 16 made up of a p-InP layer is disposed on the first light confining layer 18, and a double heterojunction layer 14 is disposed on the second first-cladding layer 16. According to the fourth embodiment, the double heterojunction layer 14 is an etching stopper layer and is made up of a p-AlGaInAs layer. A first first-cladding layer 12 made up of a p-InP layer is disposed on the double heterojunction layer 14, and a p-InGaAs contact layer 104 is disposed on the first first-cladding layer 12.

The p-InGaAs contact layer 104 and the first first-cladding layer 12 are formed using the double heterojunction layer 14 as an etching stopper layer to precisely form a stripe mesa ridge 106.

A passivation film 108 of SiO$_2$ covers the sides of the ridge 106 and the portions of the double heterojunction layer 14 exposed when the ridge 106 was formed. (The passivation film 108 has an opening 108a exposing the top of the ridge 106.) An anode electrode 90 is disposed on the p-InGaAs contact layer 104 through the opening 108a, while a cathode electrode 88 is disposed on the rear surface of the n-InP substrate 102.

Thus, according to the fourth embodiment, the optical waveguide laminated structure 10 is made up of the first first-cladding layer 12, the double heterojunction layer 14, the second first-cladding layer 16, the first light confining layer 18, the active layer 20, the second light confining layer 22, and the second-cladding layer 24, as in the first embodiment.

Further, according to the fourth embodiment, the optical waveguide laminated structure 10 is disposed on the n-InP substrate 102 such that the second-cladding layer 24 (an n-type layer) is adjacent to the n-InP substrate 102.

Thus, the optical waveguide laminated structure 10 of the fourth embodiment is the same as that of the first embodiment. That is, heterojunctions of the second kind are formed at the interfaces between the first first-cladding layer 12 and the double heterojunction layer 14 and between the double heterojunction layer 14 and the second first-cladding layer 16.

Therefore, since the energy level for minority carriers in the double heterojunction layer 14 (which has a lower bandgap energy than the first and second first-cladding layers 12 and 16) is higher than those in the first and second first-cladding layers 12 and 16, the electron concentration within the double heterojunction layer 14 is lower than those of the first and second first-cladding layers 12 and 16 adjacent to it.

This means that few electrons accumulate in the double heterojunction layer 14 even though holes accumulate therein, reducing the probability of recombination between electrons and holes within the double heterojunction layer 14 and hence reducing the recombination current. Therefore, it is possible to prevent an increase in the threshold current and a reduction in the luminous efficiency due to the recombination current, providing a semiconductor laser device having high efficiency.

The present embodiment has been described with respect to a semiconductor laser in which the optical waveguide laminated structure 10 of the first embodiment is disposed on the n-InP substrate such that the second cladding layer 24 made up of an n-type semiconductor layer is adjacent to and faces the n-InP substrate. However, the present embodiment may be applied to a semiconductor laser in which the optical waveguide laminated structure 10 of the second variation (of the first embodiment) or the optical waveguide laminated structure 50 of the second embodiment is disposed on an n-InP substrate such that the second cladding layer 24 made up of an n-type semiconductor layer is adjacent to and faces the n-InP substrate.

As described above, according to the present embodiment, a ridge type semiconductor laser is configured such that heterojunctions of the second kind are formed at the interfaces between the first first-cladding layer 12 and the double heterojunction layer 14 (an etching stopper layer) and between the double heterojunction layer 14 and the second first-cladding layer 16. This arrangement prevents either minority carriers or majority carriers from accumulating in the double heterojunction layer 14, thereby reducing the probability of recombination between electrons and holes within the double heterojunction layer 14 and hence reducing the recombination current. Therefore, it is possible to prevent an increase in the threshold current and a reduction in the luminous efficiency due to the recombination current, providing a ridge type semiconductor laser device having high efficiency.

As described above, the semiconductor laser devices of the present invention are suitable as light sources for optical communications and optical disk devices, which require high efficiency.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device comprising:
    a first semiconductor layer of a first conductive type having a first bandgap energy and a first impurity concentration;
    a second semiconductor layer of the first conductive type having a second bandgap energy and a second impurity concentration, laminated on said first semiconductor layer;
    an active layer having a third bandgap energy lower than said first and second bandgap energies, laminated on said first semiconductor layer with said second semiconductor layer interposed between said active layer and said first semiconductor layer;
    a third semiconductor layer of a second conductive type having a fourth bandgap energy higher than said third bandgap energy, laminated on said first semiconductor layer with said active layer and said second semiconductor layer interposed between said third semiconductor layer and said first semiconductor layer;
    a fourth semiconductor layer of said first conductive type having a third impurity concentration, disposed between said first semiconductor layer and said second semiconductor layer, and having both a higher conduction band energy level than the conduction band energy levels of said first and second semiconductor layers and a higher valence band energy level than the valence band energy levels of said first and second semiconductor layers, or having both a lower conduction band energy level than the conduction band energy levels of said first and second semiconductor layers and a lower valence band energy level than the valence band energy level of said first and second semiconductor layers; and
    a semiconductor substrate disposing, on a surface thereof, said first semiconductor layer, said second semiconductor layer, said active layer, said third semiconductor layer, and said fourth semiconductor layer such that either said first semiconductor layer or said third semiconductor layer is adjacent to and opposes said semiconductor substrate, and having the same conductive type as that of said one of said first semiconductor layer and said third semiconductor layer being adjacent to said semiconductor substrate.

2. The semiconductor laser device according to claim 1, wherein:
    when said first conductive type is p-type, said fourth semiconductor layer has both a higher conduction band energy level than the conduction band energy levels of said first and second semiconductor layers and a higher valence band energy level than the valence band energy levels of said first and second semiconductor layers; and
    when said first conductive type is n-type, said fourth semiconductor layer has both a lower conduction band energy level than the conduction band energy levels of said first and second semiconductor layers and a lower valence band energy level than the valence band energy levels of said first and second semiconductor layers.

3. The semiconductor laser device according to claim 1, further comprising:
a fifth semiconductor layer disposed between said first semiconductor layer and said fourth semiconductor layer, wherein when said first conductive type is n-type, said fifth semiconductor layer has an intermediate conduction band energy level between the conduction band energy levels of said first and fourth semiconductor layers, and when said first conductive type is p-type, said fifth semiconductor layer has an intermediate valence band energy level between the valence band energy levels of said first and fourth semiconductor layers; and
a sixth semiconductor layer disposed between said second semiconductor layer and said fourth semiconductor layer, wherein when said first conductive type is n-type, said sixth semiconductor layer has an intermediate conduction band energy level between the conduction band energy levels of said second and fourth semiconductor layers, and when said first conductive type is p-type, said sixth semiconductor layer has an intermediate valence band energy level between the valence band energy levels of said second and fourth semiconductor layers.

4. The semiconductor laser device according to claim 1, wherein said fourth semiconductor layer is a diffraction grating layer.

5. The semiconductor laser device according to claim 1, wherein said fourth semiconductor layer is an etching stopper layer.

6. The semiconductor laser device according to claim 1, wherein said third impurity concentration is higher than said first and second impurity concentrations.

* * * * *